(12) United States Patent
Xiang et al.

(10) Patent No.: US 6,943,087 B1
(45) Date of Patent: Sep. 13, 2005

(54) SEMICONDUCTOR ON INSULATOR MOSFET HAVING STRAINED SILICON CHANNEL

(75) Inventors: Qi Xiang, San Jose, CA (US); Jung-Suk Goo, Stanford, CA (US); James N. Pan, Fishkill, NY (US); Ming Ren Lin, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/738,529

(22) Filed: Dec. 17, 2003

(51) Int. Cl.[7] .................. H01L 21/331; H01L 21/8222
(52) U.S. Cl. .................. 438/311; 438/149; 438/183
(58) Field of Search ................. 438/149, 183, 438/216, 287, 311, 926

(56) References Cited

U.S. PATENT DOCUMENTS

| | | | |
|---|---|---|---|
| 6,586,808 B1 * | 7/2003 | Xiang et al. ........... | 257/407 |
| 6,620,664 B2 * | 9/2003 | Ma et al. ............... | 438/183 |
| 6,815,297 B1 * | 11/2004 | Krivokapic et al. ...... | 438/287 |

OTHER PUBLICATIONS

Epitaxial Semiconductor/High-K Ternary Oxide Heterostructures, Darrell G. Schlom, 2003.

Structural and optical properties of epitaxial BaTiO$_3$ thin films grown on GdScO$_3$ (110), J. Schubert et al., Applied Physics Letters, vol. 82, No. 20, p. 3460-62, May 19, 2003.
Solid State Electronic Devices, Ben G. Streetman, p. 1-13, 1980, Prentice-Hall, Inc.
Molecular Beam Epitaxial Growth of Oxide Thin Films, Darrell G. Schlom, www.matse.psu.edu/faculty/schlom.html, 2004.
Structure, Vibration and Electron Density in Neodymium-Iron-Boride and some Rare-Earth Perovskite Oxides, Douglas J. du Boulay, Thesis, University of Western Australia, Chapter 3, 1996.

* cited by examiner

*Primary Examiner*—Phat X. Cao
*Assistant Examiner*—Theresa T. Doan
(74) *Attorney, Agent, or Firm*—Foley & Lardner LLP

(57) ABSTRACT

Strained silicon is grown on a dielectric material in a trench in a silicon germanium layer at a channel region of a MOSFET after fabrication of other MOSFET elements using a removable dummy gate process to form an SOI MOSFET. The MOSFET is fabricated with the dummy gate in place, the dummy gate is removed, and a trench is formed in the channel region. Dielectric material is grown in the trench, and strained silicon is then grown from the silicon germanium trench sidewalls to form a strained silicon layer that extends across the dielectric material. The silicon germanium sidewalls impart strain to the strained silicon, and the presence of the dielectric material allows the strained silicon to be grown as a thin fully depleted layer. A replacement gate is then formed by damascene processing.

15 Claims, 10 Drawing Sheets

US 6,943,087 B1

SEMICONDUCTOR ON INSULATOR MOSFET HAVING STRAINED SILICON CHANNEL

BACKGROUND OF THE INVENTION

1. Field of the Invention

The present invention relates generally to fabrication of metal oxide semiconductor field effect transistors (MOSFETs), and, more particularly, to MOSFETs that achieve improved carrier mobility through the incorporation of strained silicon.

2. Related Technology

MOSFETs are a common component of integrated circuits (ICs). FIG. 1 shows a cross sectional view of a conventional MOSFET device. The MOSFET is fabricated on a silicon substrate 10 within an active region bounded by shallow trench isolations 12 that electrically isolate the active region of the MOSFET from other IC components fabricated on the substrate 10.

The MOSFET is comprised of a gate 14 and a channel region 16 that are separated by a thin gate insulator 18 such as silicon oxide or silicon oxynitride. A voltage applied to the gate 14 controls the creation of an inversion layer that provides carriers for conduction in the channel region 16 between source and drain regions. To minimize the resistance of the gate 14, the gate 14 is typically formed of a heavily doped semiconductor material such as polysilicon.

The source and drain regions of the MOSFET comprise deep source and drain regions 20 formed on opposing sides of the channel region 16. The deep source and drain regions 20 are formed by ion implantation subsequent to the formation of a spacer 22 around the gate 14. The spacer 22 serves as a mask during implantation to define the lateral positions of the deep source and drain regions 20 relative to the channel region 16.

The source and drain regions of the MOSFET further comprise shallow source and drain extensions 24. As dimensions of the MOSFET are reduced, short channel effects resulting from the small distance between the source and drain cause degradation of MOSFET performance. The use of shallow source and drain extensions 24 rather than deep source and drain regions near the ends of the channel 16 helps to reduce short channel effects. The shallow source and drain extensions 24 are implanted after the formation of a protective layer 26 around the gate 14 and over the substrate, and prior to the formation of the spacer 22. The gate 14 and the protective layer 26 act as an implantation mask to define the lateral position of the shallow source and drain extensions 24 relative to the channel region 16. Diffusion during subsequent annealing causes the shallow source and drain extensions 24 to extend slightly beneath the gate 14.

Source and drain silicides 28 are formed on the deep source and drain regions 20 to provide ohmic contacts and reduce contact resistance. The silicides 28 are comprised of the substrate semiconductor material and a metal such as cobalt (Co) or nickel (Ni). The deep source and drain regions 20 are formed deeply enough to extend beyond the depth to which the source and drain silicides 28 are formed. The gate 14 likewise has a silicide 30 formed on its upper surface. A gate structure comprising a polysilicon material and an overlying silicide as shown in FIG. 1 is sometimes referred to as a polycide gate.

One option for increasing the performance of MOSFETs is to enhance the carrier mobility of the MOSFET semiconductor material so as to reduce resistance and power consumption and to increase drive current, frequency response and operating speed. A method of enhancing carrier mobility that has become a focus of recent attention is the use of silicon material to which a tensile strain is applied. "Strained" silicon may be formed by growing a layer of silicon on a silicon germanium substrate. The silicon germanium lattice is more widely spaced on average than a pure silicon lattice because of the presence of the larger germanium atoms in the lattice. Since the atoms of the silicon lattice align with the more widely spaced silicon germanium lattice, a tensile strain is created in the silicon layer. The silicon atoms are essentially pulled apart from one another. The amount of tensile strain applied to the silicon lattice increases with the proportion of germanium in the silicon germanium lattice.

The tensile strain applied to the silicon lattice increases carrier mobility. Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

An example of a MOSFET incorporating a strained silicon layer is shown in FIG. 2. The MOSFET is fabricated on a substrate comprising a silicon germanium layer 32 grown on a silicon layer 10. An epitaxial layer of strained silicon 34 is grown on the silicon germanium layer 32. The MOSFET uses conventional MOSFET structures including deep source and drain regions 20, shallow source and drain extensions 24, a gate oxide layer 18, a gate 14 surrounded by a protective layer 26, a spacer 22, source and drain silicides 28, a gate silicide 30, and shallow trench isolations 12. The channel region of the MOSFET includes the strained silicon material, which provides enhanced carrier mobility between the source and drain.

An alternative to the formation of devices on semiconductor substrates is silicon on insulator (SOI) construction. In SOI construction, MOSFETs are formed on a substrate that includes a layer of a dielectric material beneath the MOSFET active regions. SOI devices have a number of advantages over devices formed in a semiconductor substrate, such as better isolation between devices, reduced leakage current, reduced latch-up between CMOS elements, reduced chip capacitance, and reduction or elimination of short channel coupling between source and drain regions.

FIG. 3 shows an example of a strained silicon MOSFET formed on an SOI substrate. In this example, the MOSFET is formed on an SOI substrate that comprises a silicon germanium layer 32 provided on a dielectric layer 36. The MOSFET is formed within an active region defined by trench isolations 12 that extend through the silicon germanium layer 32 to the underlying dielectric layer 36. The SOI substrate may be formed by a buried oxide (BOX) method or by a wafer bonding method. In one alternative to the SOI construction shown in FIG. 3, strained silicon FinFETs comprised of monolithic silicon germanium FinFET bodies having strained silicon grown thereon may be patterned from the silicon germanium layer of the SOI substrate.

The substrate for a strained silicon SOI device may be formed in a variety of manners. FIGS. 4a–4b show structures formed using a buried oxide (BOX) method. As shown in FIG. 4a, a substrate is provided that comprises a layer of silicon germanium 38. The silicon germanium layer 38 is typically grown on a silicon wafer (not shown). The silicon germanium layer 38 is implanted with oxygen 40 at an energy sufficient to form an oxygenated region 42 at such a depth as to leave a required thickness of silicon germanium above the oxygenated region 42. FIG. 4b shows the structure of FIG. 4a after annealing of the silicon germanium 38 to form a buried silicon oxide layer 44 within the silicon germanium 38. Annealing is typically performed at approximately 1350 degrees C. for approximately four hours. During annealing the germanium in the oxygenated region migrates to the boundaries of the surrounding non-oxygenated region. The silicon oxide layer 44 serves as the dielectric layer of the SOI substrate, and strained silicon may be grown on the silicon germanium overlying the silicon oxide layer.

FIGS. 5a–5d show structures formed in accordance with a wafer bonding method. FIG. 5a shows a substrate that includes a planarized layer of silicon germanium 46. The silicon germanium is typically grown on a silicon wafer (not shown). The silicon germanium 46 is implanted with hydrogen 48 to form a hydrogen rich region 50 within the silicon germanium material. The hydrogen 48 is implanted with an energy such that the amount of silicon remaining above the hydrogen rich region exceeds the thickness of the silicon germanium layer to be formed on the SOI substrate. In some applications a different material such as oxygen may be implanted. FIG. 5b shows the silicon germanium layer 46 of FIG. 5a after being cleaned, stripped of oxide in a diluted HF solution, rinsed in deionized water to form an active native oxide on its surface, and then inverted and bonded to a planarized oxide layer 54 formed on a semiconductor layer 56 of a second substrate 52. To facilitate bonding, adjoining surfaces of the substrates are planarized to a homogeneity of 0.5 microns or less.

Bonding is generally performed in two stages. In a first stage, the substrates are heated to approximately 600 degrees C. in an inert environment for approximately three hours. As shown in FIG. 5c, the heating of the first stage causes bonding of the silicon germanium layer 46 to the dielectric layer 54 of the second substrate 52 due to Van der Waals forces. The heating of the first stage also causes the silicon germanium layer 46 to fracture in the hydrogen rich region 50. After the first heating stage the fractured portion of the silicon germanium layer may be removed, leaving a new substrate comprising a silicon germanium layer 58 bonded to an oxide layer 54, and having a residual hydrogen rich region 50 at its upper surface. In a second stage of the bonding process, the bonded structure is heated to approximately 1050–1200 degrees C. for 30 minutes to two hours to strengthen the bond between the dielectric layer 54 and the silicon germanium layer 58. The resulting substrate is then planarized and cleaned, leaving a silicon germanium SOI substrate as shown in FIG. 5d.

One problem with conventional strained silicon devices is that growth of the strained silicon layer on the substrate prior to formation of MOSFET elements causes a significant amount of the strained silicon to be consumed during subsequent processing. Another problem is the formation of "misfit dislocations" in the strained silicon that effectively release the strain applied to the silicon lattice. Misfit dislocations are primarily caused by mismatches between the strained silicon lattice and the lattice of the underlying silicon germanium supporting layer. The amount of misfit dislocations in a strained silicon layer may be increased as the result of thermal factors. One instance in which misfit dislocations may be caused by thermal factors is during cooling after deposition of a strained silicon layer. Another instance in which misfit dislocations may occur is during exposure to high temperatures, e.g. 1000 degrees C. and higher, which are often employed for forming elements such as shallow trench isolations. Such high temperatures are believed to cause depletion of the germanium content of the silicon germanium substrate, leading to formation of misfit dislocations in the overlying strained silicon. The rate of formation of misfit dislocations rises exponentially with increases in temperature.

It has been determined that a strained silicon layer has a critical thickness, above which misfit dislocations become significantly more likely to occur. The critical thickness depends on the amount of tensile strain applied to the silicon lattice, and thus on the germanium content of the underlying silicon germanium layer. For example, it has been determined that a silicon germanium layer having approximately 20% germanium content can support a critical thickness of approximately 200 Angstroms without the risk of significant misfit dislocations, whereas a silicon germanium layer having approximately 30% germanium content can support a critical thickness of only approximately 80 Angstroms.

Therefore the application of current strained silicon technology to MOSFET design is constrained by conflicting limitations, in that strained silicon carrier mobility is enhanced by an increase in the germanium content of the underlying layer, yet the critical thickness of the strained silicon is reduced by an increase of the germanium content of the underlying layer. These conflicts make practical applications difficult to achieve. For example, it has been determined empirically that at least approximately 70 Angstroms of strained silicon are required to provide a meaningful improvement in MOSFET performance. However, in order to account for consumption of silicon during conventional processing, a layer of approximately double that thickness must be formed initially, and to avoid misfit dislocation in a layer of such thickness, the germanium content of the underlying layer must be restricted to approximately 20%. The resulting strain applied to the strained silicon layer has been found to have relatively little effect on hole mobility, and therefore it is difficult to provide a meaningful application of strained silicon in PMOS devices. In addition to the foregoing considerations, the tensile strain of the strained silicon layer and hence its carrier mobility may be further degraded through the formation of misfit dislocations caused by both the increases and the decreases in temperature that are typically encountered during processing, such as during formation of shallow trench isolations. Therefore, while the limiting factors of strained silicon technology can be balanced to achieve limited carrier mobility enhancement in some applications, current technology does not offer a way to impart enough strain to produce significant carrier mobility enhancement without also introducing mobility-reducing defects and strain relaxation.

An additional complication of strained silicon technology is that it is difficult to form fully depleted SOI devices with strained silicon channels. Fully depleted SOI MOSFETs are preferably implemented as devices in which the thickness of the semiconductor material in the channel region is less than the thickness of the depletion region. However, given the need to provide a supporting layer of silicon germanium beneath the strained silicon channel, the total channel thickness becomes greater than that of the depletion region, or the thickness of strained silicon is not sufficient to provide significant mobility enhancement.

SUMMARY OF THE INVENTION

In accordance with embodiments of the invention, strained silicon is grown on a dielectric material in a trench in a silicon germanium layer at a channel region of a MOSFET after fabrication of other MOSFET elements using a removable dummy gate process. The MOSFET is fabricated with the dummy gate in place, the dummy gate is removed, and a trench is formed in the channel region. Dielectric material is grown in the trench, and strained silicon is then grown from the silicon germanium trench sidewalls to form a strained silicon layer that extends across the dielectric material. The silicon germanium sidewalls impart strain to the strained silicon, and the presence of the dielectric material allows the strained silicon to be grown as a thin fully depleted layer. A replacement gate is then formed by damascene processing.

In accordance with one embodiment of the invention, a strained silicon SOI MOSFET is formed on a substrate comprising a layer of silicon germanium. The MOSFET includes a strained silicon channel formed on a dielectric material in a trench in the silicon germanium layer between the MOSFET source and drain regions.

In accordance with further embodiments of the invention, a semiconductor device, a strained silicon SOI MOSFET is formed. Initially a substrate is provided. The substrate comprises a dummy gate that overlies a silicon germanium layer formed on a dielectric layer. A protective layer is formed over the dummy gate, and the protective layer is planarized to expose the dummy gate. The dummy gate is removed, and a trench is etched in the channel region of the silicon germanium layer. Dielectric material is formed in the trench, and strained silicon is then grown on the dielectric material in the trench to form a strained silicon channel region.

DESCRIPTION OF THE DRAWINGS

Embodiments of the invention are described in conjunction with the following drawings, in which.

DETAILED DESCRIPTION OF PREFERRED EMBODIMENTS

Figure 1:
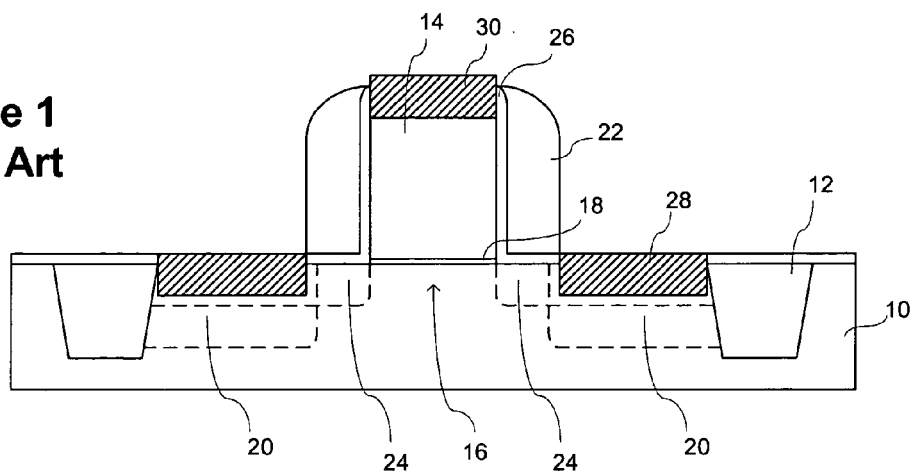
FIG. 1 shows a conventional MOSFET formed in accordance with conventional processing.
Figure 2:
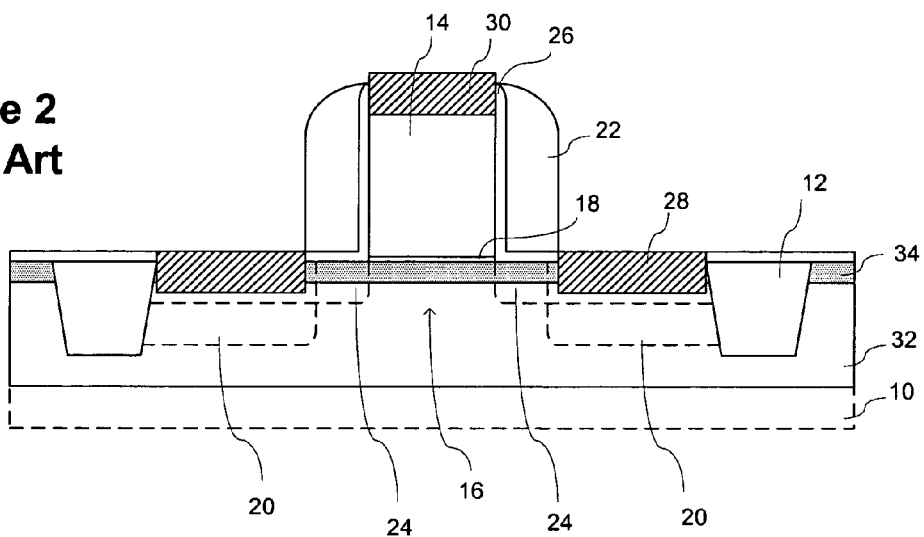
FIG. 2 shows a strained silicon MOSFET device.
Figure 3:
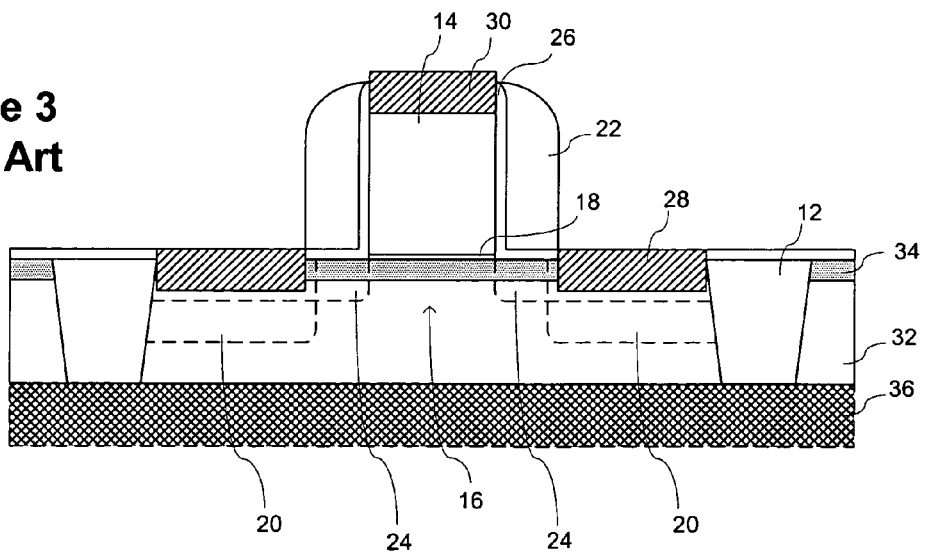
FIG. 3 shows a strained silicon MOSFET device formed on an SOI substrate.
Figure 4A:
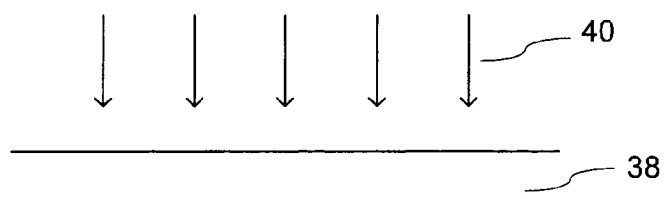
FIGS. 4a and 4b show the formation of a buried oxide (BOX) SOI substrate.
Figure 4B:
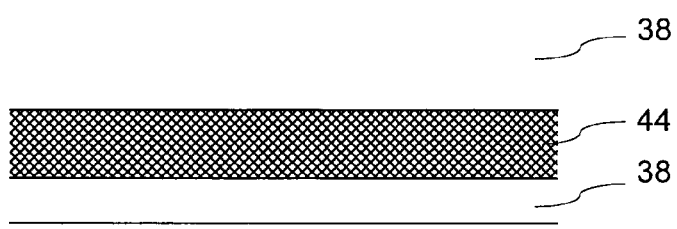
Figure 5A:
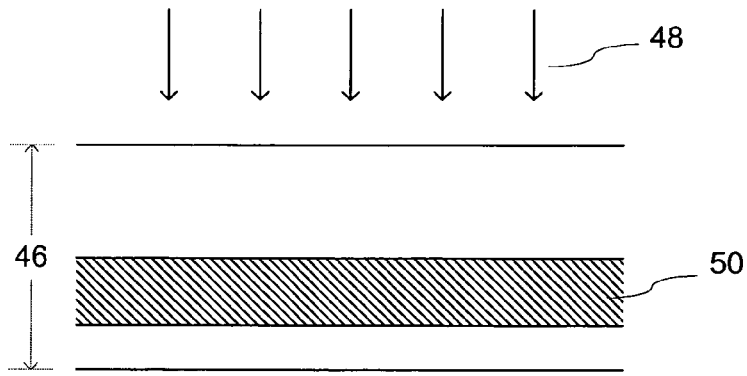
FIGS. 5a, 5b, 5c and 5d show the formation of a SOI substrate by a wafer bonding method.
Figure 5B:
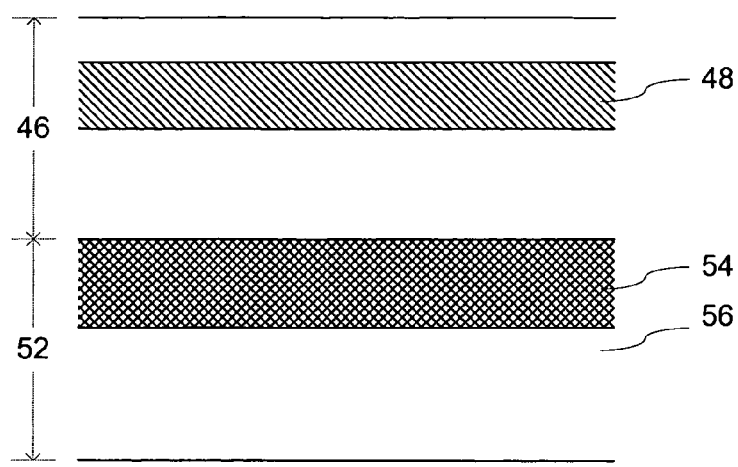
Figure 5C:
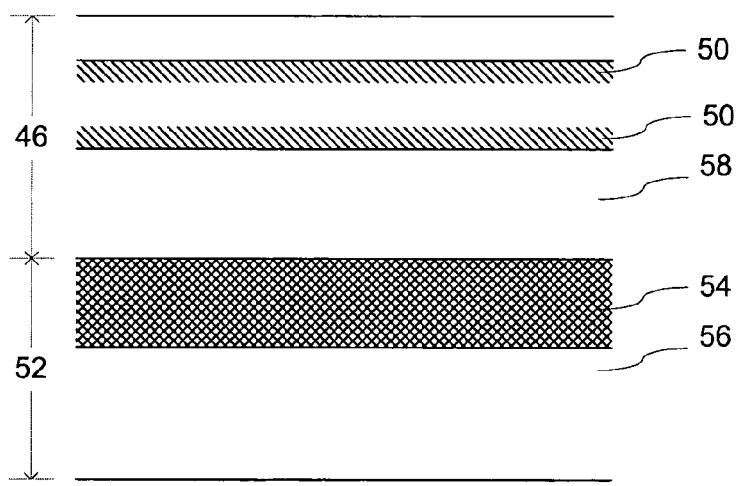
Figure 5D:
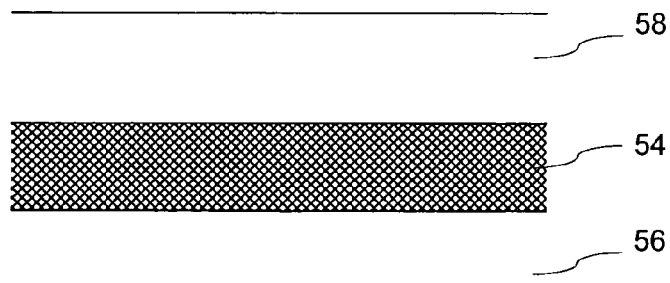
Figure 6A:
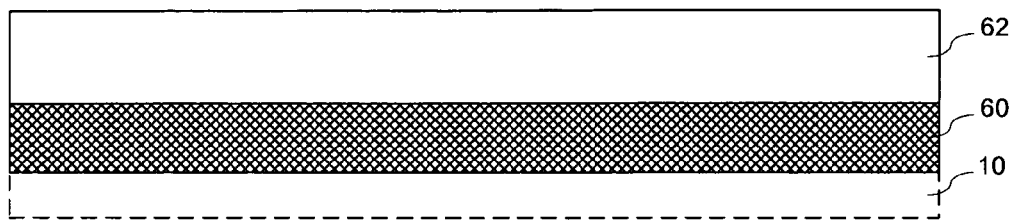
FIGS. 6a, 6b, 6c, 6d, 6e, 6f, 6g, 6h, 6i, 6j, 6k and 6L show structures formed during production of a strained silicon SOI MOSFET device in accordance with a preferred embodiment of the invention.

FIGS. 6a-6L show structures formed during fabrication of a strained silicon SOI MOSFET in accordance with a preferred embodiment of the invention. FIG. 6a shows an SOI substrate comprising a semiconductor material 10 such as silicon or silicon germanium. The semiconductor material 10 has formed thereon a dielectric layer 60 such as silicon oxide, and a silicon germanium layer 62 is formed on the dielectric layer 60.

The silicon germanium layer 62 has a composition $Si_{1-x}Ge_x$, where x is preferably approximately 0.3, and is more generally in the range of 0.1 to 0.4. The silicon germanium layer 62 may be bonded to the dielectric layer 60 in a wafer bonding process, or the dielectric layer 60 may be formed within the silicon germanium layer 62 by a buried oxide process. Silicon germanium may be grown on a silicon wafer, for example, by chemical vapor deposition using $Si_2H_6$ (disilane) and $GeH_4$ (germane) as source gases, with a substrate temperature of 600 to 900 degrees C., a $Si_2H_6$ partial pressure of 30 mPa, and a $GeH_4$ partial pressure of 60 mPa. $SiH_4$ (silane) may be used as a source of silicon in alternative processes. The upper portion of the silicon germanium substrate 62 should have an essentially uniform composition.

Figure 6B:
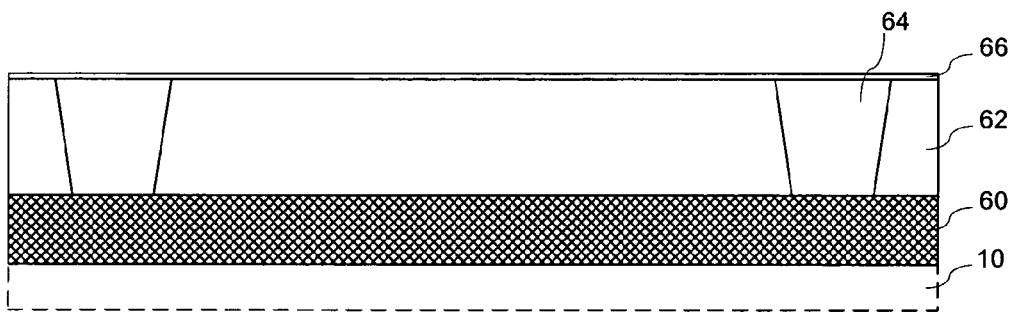

FIG. 6b shows the structure of FIG. 6a after formation of shallow trench isolations 64 in the silicon germanium layer 62, followed by formation of a protective oxide layer 66 over the silicon germanium layer 62. The shallow trench isolations 64 define an active region of the substrate in which a MOSFET will be formed. The shallow trench isolations 64 may be formed by forming trenches in the silicon germanium, performing a brief thermal oxidation of the silicon germanium, and then depositing a layer of silicon oxide to a thickness that is sufficient to fill the trenches, such as by low pressure CVD (LPCVD) TEOS or atmospheric pressure ozone TEOS. The silicon oxide layer is then densified and planarized such as by chemical mechanical polishing or an etch back process. In accordance with one preferred alternative, the shallow trench isolations are comprised of an oxide trench liner and a silicon carbide bulk fill material. The silicon carbide bulk fill material has high thermal conductivity and provides dissipation of heat generated in the active regions.

The protective oxide layer 66 may be grown by oxidizing the silicon germanium layer 62. During oxidation, germanium from the silicon germanium layer 62 segregates at the boundary of the oxide 66 with the silicon germanium layer 62, leaving a silicon oxide layer.

Figure 6C:
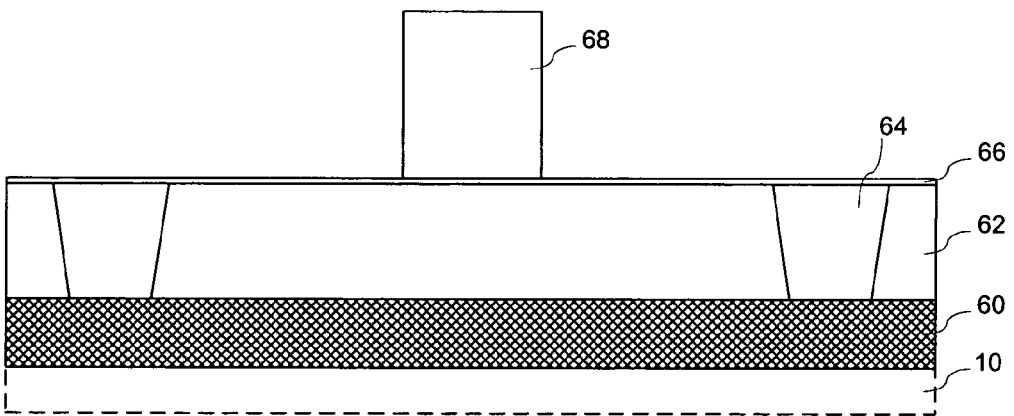

FIG. 6c shows the structure of FIG. 6b after formation of a sacrificial dummy gate 68 on the protective oxide 66 in the center of the active region defined by the shallow trench isolations 64. In the preferred embodiment the dummy gate 68 is patterned from a layer of polysilicon. However, a variety of other sacrificial materials may be used, such as amorphous carbon.

Figure 6D:
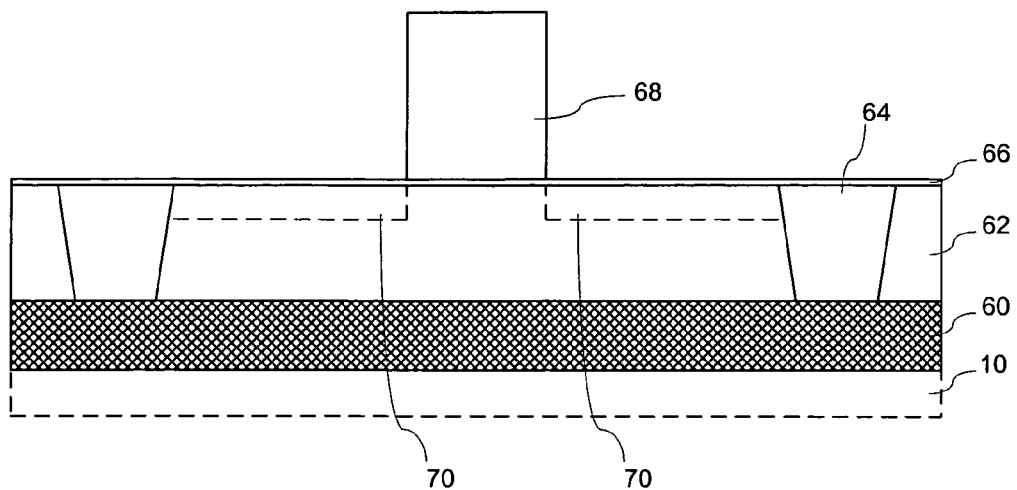

FIG. 6d shows the structure of FIG. 6c after implantation of dopant by ion implantation to form shallow source and drain extensions 70 in the silicon germanium layer 62 at opposing sides of the dummy gate 68. The dummy gate 68 serves to mask the channel region during this implantation. Halo regions (not shown) may be implanted prior to implantation of the shallow source and drain extensions 70. Halo regions are regions that are implanted with a dopant that has a conductivity type that is opposite to that of the source and drain region dopants. The dopant of the halo regions retards diffusion of the dopant of the source and drain extensions. Halo regions are preferably implanted using a low energy at an angle to the surface of the substrate so that the halo regions extend beneath the dummy gate 68 to beyond the anticipated locations of the ends of the source and drain extensions 70 after annealing.

Figure 6E:
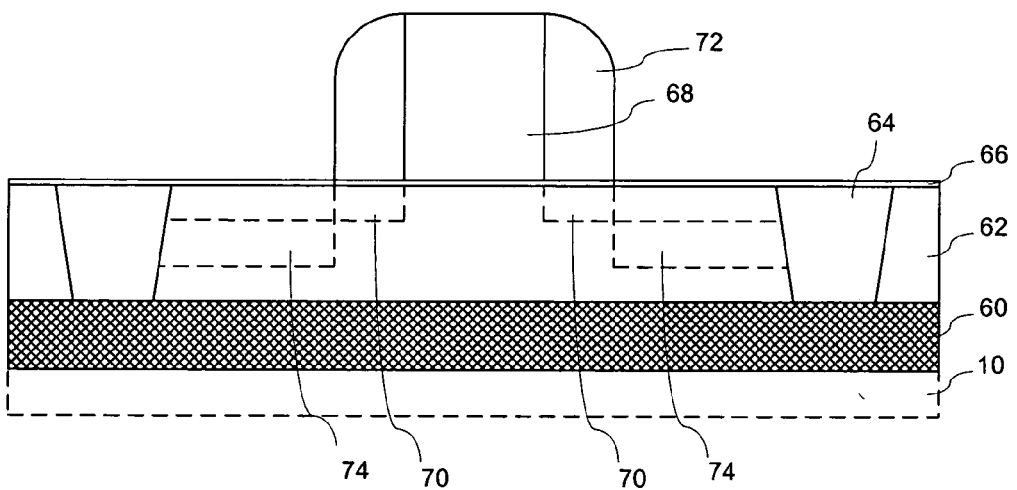

FIG. 6e shows the structure of FIG. 6d after formation of a spacer 72 around the dummy gate 68, followed by implantation of deep source and drain regions 74 in the silicon germanium layer 62. The spacer 72 is preferably formed of silicon oxide. The spacer 72 may be formed by depositing a conformal layer of silicon oxide, followed by an etch back process to remove the silicon oxide from the substrate, leaving silicon oxide on the sidewalls of the gate as the spacer 72. The spacer 72 serves as a mask during implantation of the deep source and drain regions 74 to define the lateral positions of the deep source and drain regions 74 relative to the dummy gate 68.

Figure 6F:
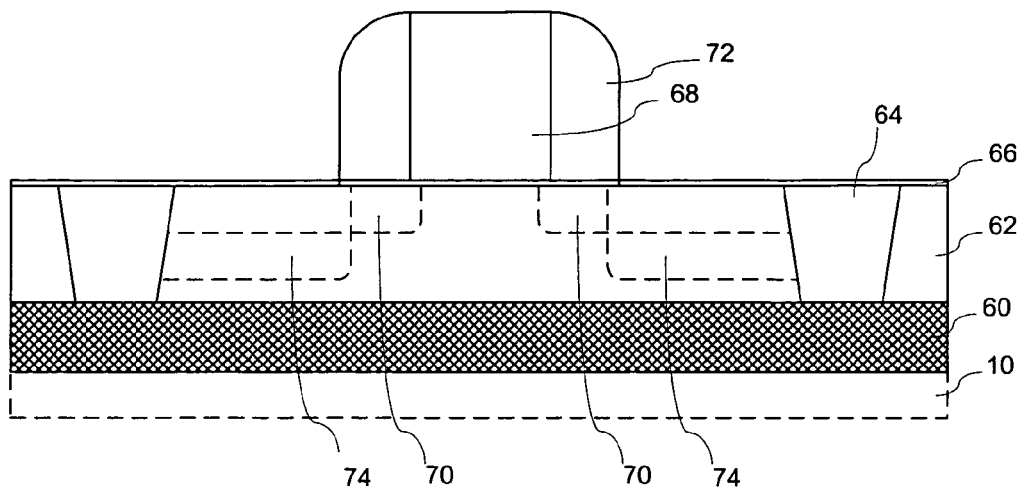

FIG. 6f shows the structure of FIG. 6e after performing rapid thermal annealing (RTA) to anneal the silicon germanium layer 62 and to activate the dopants implanted in the shallow source and drain extensions 70 and the deep source and drain regions 74. During annealing the implanted dopant undergoes diffusion, causing a smoothing of the contours of the respective regions.

Figure 6G:
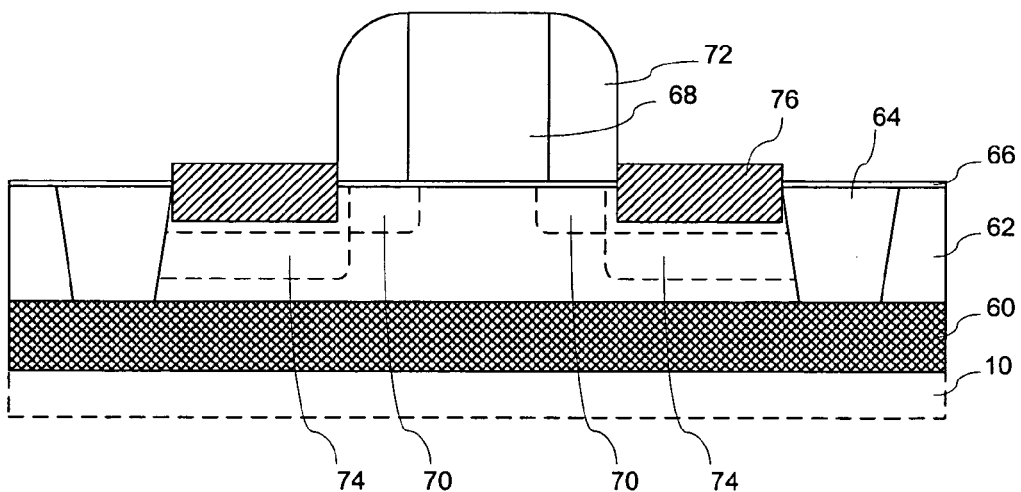

FIG. 6g shows the structure of FIG. 6f after formation of source and drain silicides 76. The silicides 76 are formed of a compound comprising a semiconductor material and a metal. Typically a metal such as cobalt (Co) is used, however other metals such as nickel (Ni) may also be employed. The silicides 76 are formed by depositing a thin conformal layer of the metal over the entire structure, and then annealing to promote silicide formation at the points of contact between the metal and underlying semiconductor materials, followed by stripping of residual metal. Formation of silicides is typically preceded by a patterning step to remove oxides and protective layers from portions of the source and drain regions where the silicides are to be formed.

Figure 6H:
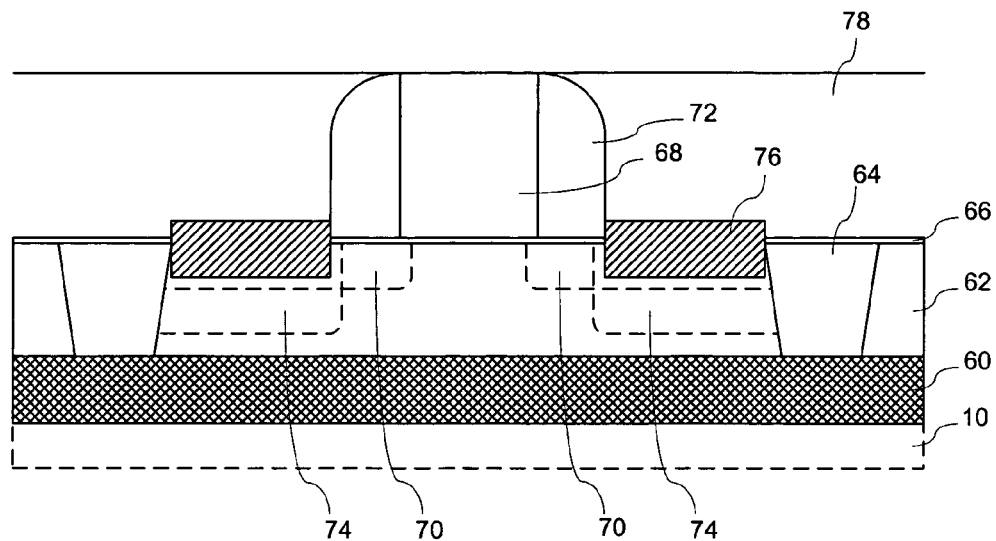

FIG. 6h shows the structure of FIG. 6g after deposition of a conformal protective oxide layer 78 over the MOSFET elements of FIG. 6g, followed by planarization of the protective oxide layer 78 to expose the dummy gate 68.

Figure 6I:
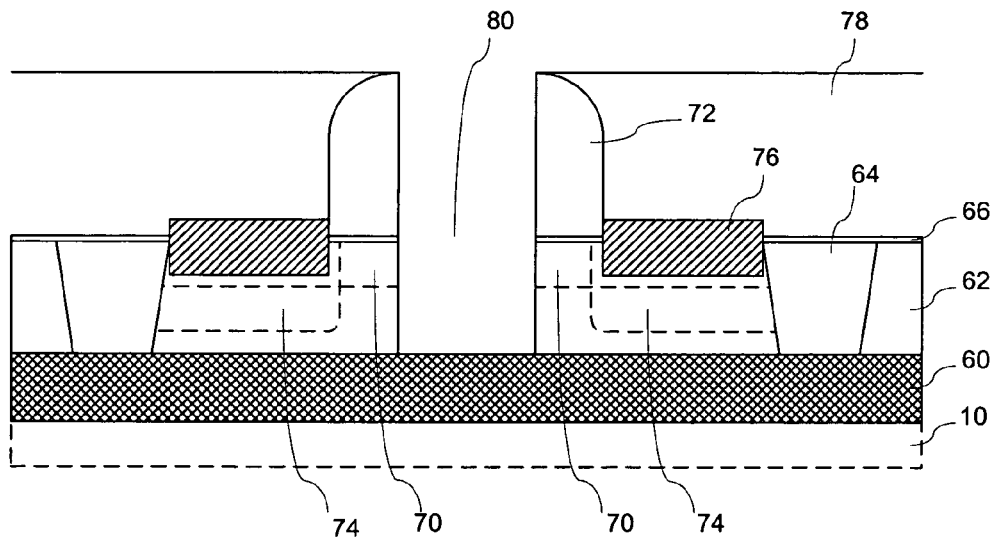

FIG. 6i shows the structure of FIG. 6h after removal of the dummy gate, followed by removal of the protective layer 66 beneath the dummy gate and etching of a trench 80 in the silicon germanium layer 62. The trench 80 is self aligned with respect to the spacer 72, and extends to the dielectric layer 60. The dummy gate may be removed using a conventional silicon etchant. The protective oxide layer may then be removed by a wet etch in dilute HF or a $CF_4$/Ar plasma etch. The trench in the silicon germanium layer may then be etched using an isotropic etch process such as $CF_4$ based chemistry, $SF_6$, $SF_6$/$H_2$/$CF_4$, $CF_2Cl_2$, or HBr.

Figure 6J:
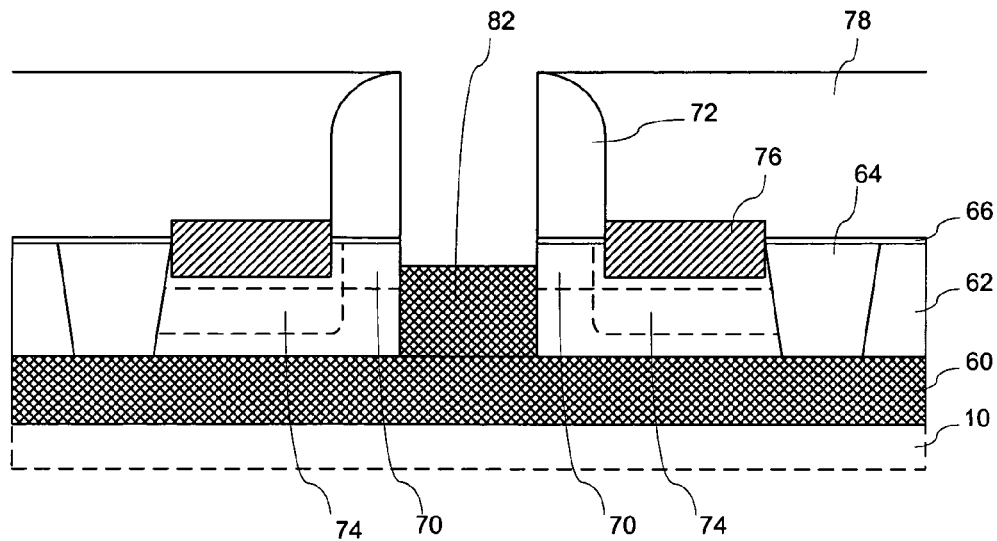

FIG. 6j shows the structure of FIG. 6i after deposition of a dielectric material 82 such as silicon oxide in the trench 80. The oxide material is grown to a height such that an overlying layer grown on the oxide 82 will be approximately aligned with the shallow source and drain extensions 70. The oxide material is grown by a CVD process to form a conformal layer, and is then subjected to an etch back to adjust its height and contours. The height of the oxide is preferably adjusted such that the subsequent channel region is aligned with the shallow source and drain extensions.

Figure 6K:
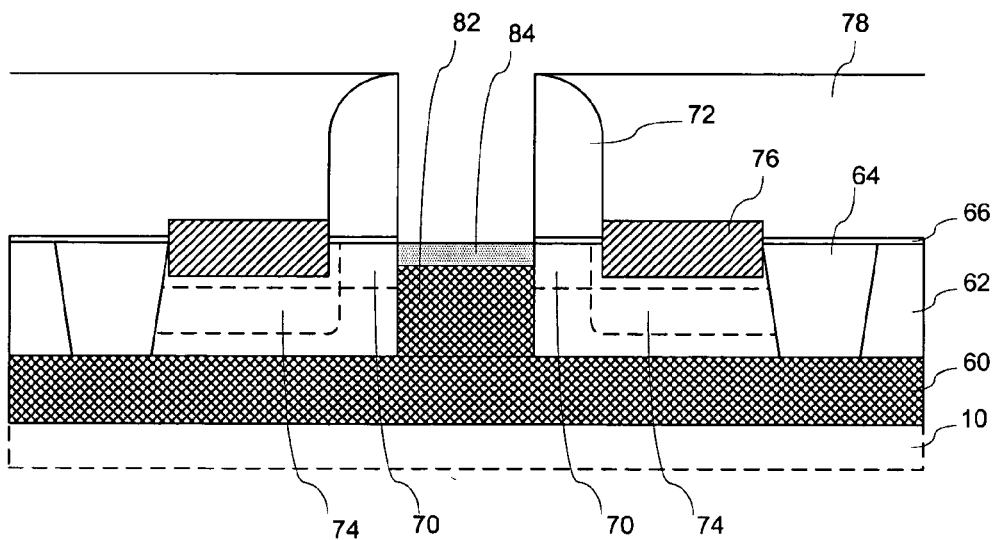

FIG. 6k shows the structure of FIG. 6j after selective growth of a strained silicon channel region 84 on the oxide 82. The strained silicon is grown from and supported by the silicon germanium material at the sidewalls of the trench and growth proceeds outward from the trench sidewalls toward the center. To provide a fully depleted channel region, the strained silicon is preferably grown to a thickness of approximately 10 to 100 Angstroms. The strained silicon typically has an initial surface profile that is curved and rough. The strained silicon surface can be smoothed through oxidation and removal of oxidized material. A hydrogen anneal may also be used to smooth the strained silicon.

Since the strained silicon is supported at its sides rather than from below, the critical thickness of the strained silicon is determined in the horizontal direction. As a result, the channel length of the device formed in this manner should be no more than twice the critical thickness based on the germanium content at the sidewalls from which the strained silicon is grown.

The strained silicon 84 is preferably grown by chemical vapor deposition using $Si_2H_6$ as a source gas with a partial pressure of 30 mPa and a substrate temperature of approximately 600 to 900 degrees C., and is grown for a sufficient time to fill the trench to approximately the level of the surface of the silicon germanium layer 62. In fully depleted SOI devices the strained silicon channel region 84 is typically left undoped, however doping may be performed in accordance with the particular implementation.

Figure 6L:
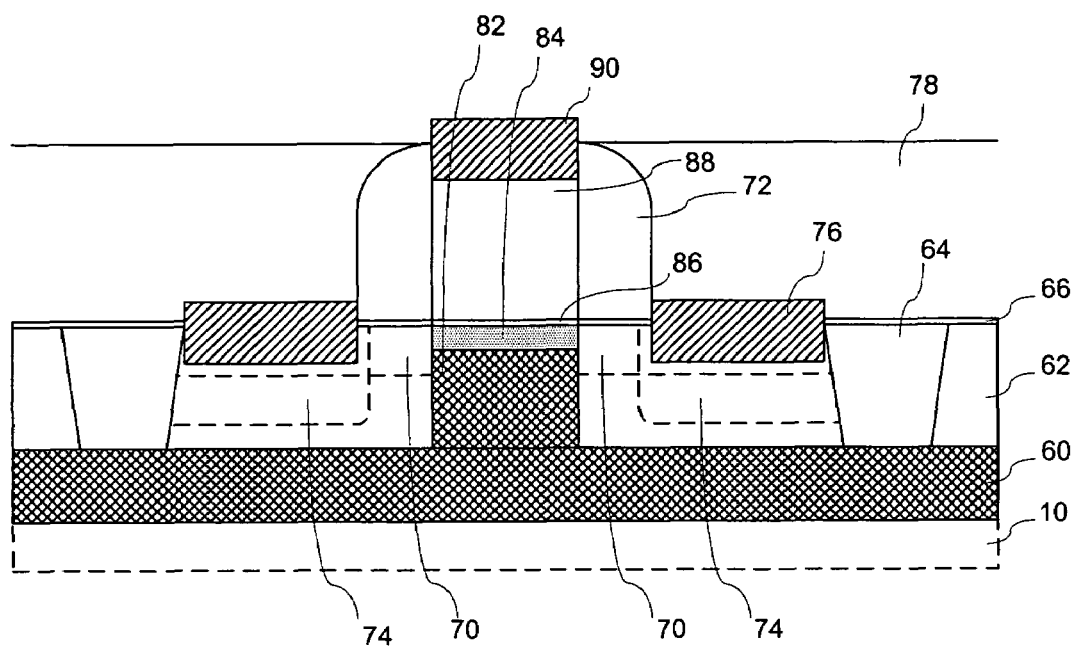

FIG. 6L shows the structure of FIG. 6k after a brief thermal oxidation of the surface of the strained silicon channel region 84 to form a gate oxide 86, followed by formation of a gate 88 and a gate silicide 90. The gate 88 is preferably a polysilicon gate that is formed by damascene processing and doped in situ or implanted with a dopant. The silicide 90 is then formed on the exposed surface of the gate 88.

The structure of FIG. 6L is advantageous as compared to conventional structures in that it enables formation of a strained silicon channel region that is thin enough to be fully depleted.

The processing of FIGS. 6a–6L represents a presently preferred embodiment, however alternative embodiments may implement different processing to achieve similar goals. For example, while the preferred embodiment forms silicon oxide in the trench, alternative embodiments may utilize a dielectric material having a lattice that is comparable to that of silicon germanium, allowing the dielectric to impart additional strain to the strained silicon. Examples of such dielectrics include $DyScO_3$ and $GdScO_3$. Other processing tasks and materials may be altered and new processing tasks and materials may be incorporated in accordance with the particular implementation to be achieved.

A variety of embodiments may therefore be implemented in accordance with the invention. In general terms, embodiments of the invention are implemented as a strained silicon SOI MOSFET formed on a substrate comprising a layer of silicon germanium. The MOSFET includes a strained silicon channel formed on a dielectric material in a trench in the silicon germanium layer between the MOSFET source and drain regions. The MOSFET may be formed in a fully depleted state by choosing an appropriate dielectric material height and strained silicon thickness.

Figure 7:
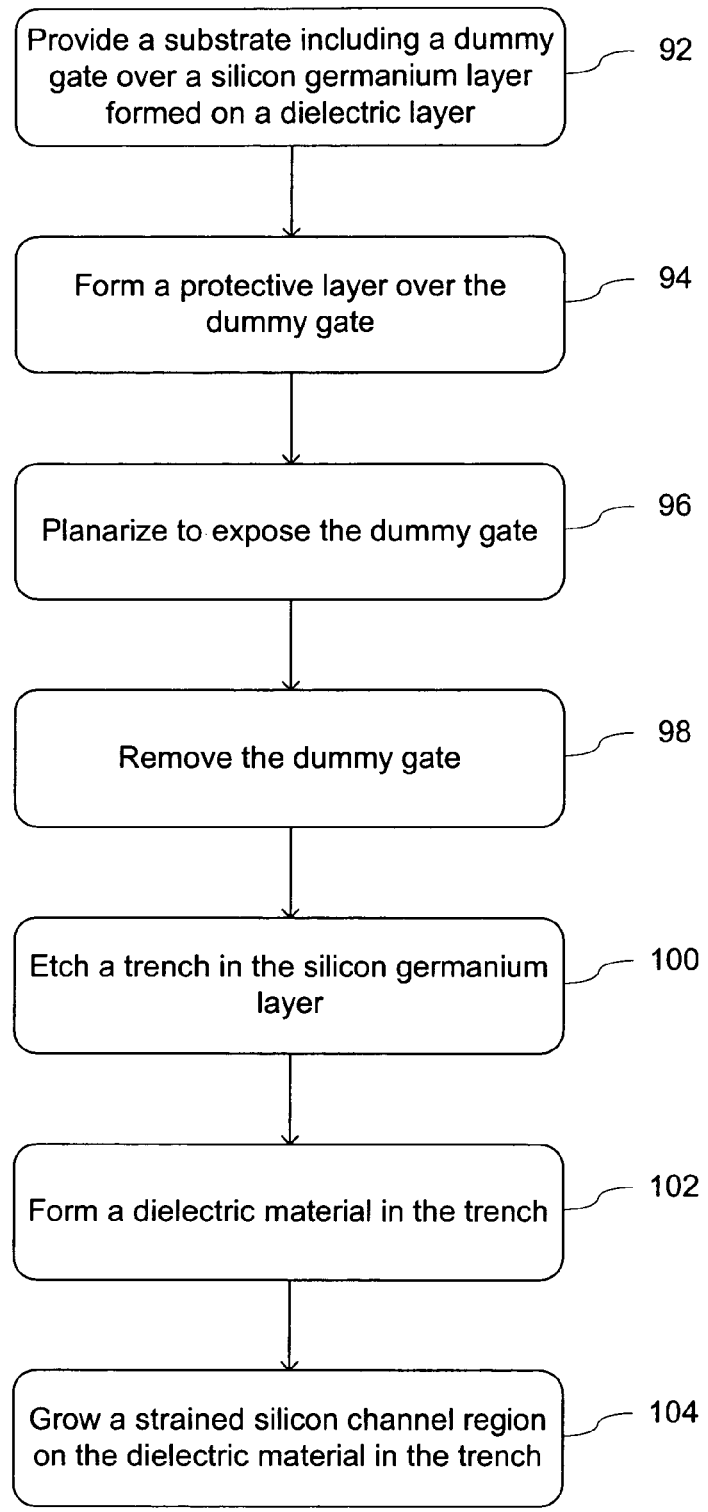
FIG. 7 shows a process flow encompassing the preferred embodiment and alternative embodiments.

FIG. 7 shows a process flow encompassing the processing of FIGS. 6a–6L, the aforementioned alternatives, and other alternatives. Initially a substrate is provided (92). The substrate comprises a dummy gate that overlies a channel region of a silicon germanium layer. A protective layer is formed over the dummy gate (94), and the protective layer is planarized to expose the dummy gate (96). The dummy gate is removed (98), and a trench is etched in the silicon germanium layer (100). A dielectric material is formed in the trench (102), and strained silicon is then grown on the dielectric material in the trench to form a strained silicon channel region (104).

The tasks described in the above processes are not necessarily exclusive of other tasks, and further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the processes described herein need not be performed on an entire substrate such as an entire wafer, but may instead be performed selectively on sections of the substrate. Also, while tasks performed during the fabrication of structure described herein are shown as occurring in a particular order for purposes of example, in some instances the tasks may be performed in alternative orders while still achieving the purpose of the process. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method for the formation of a semiconductor on insulator (SOI) device, comprising:
   providing a substrate comprising a dummy gate overlying a silicon germanium layer formed on a dielectric layer;
   forming a protective layer over the dummy gate;
   planarizing the protective layer to expose the dummy gate;
   removing the dummy gate;
   etching a trench in the silicon germanium layer at the location of the dummy gate to expose the dielectric layer;
   forming a dielectric material in the trench; and
   growing strained silicon in the trench on the dielectric material to form a strained silicon channel region.

2. The method claimed in claim 1, further comprising forming a gate insulator and a gate over the strained silicon.

3. The method claimed in claim 1, wherein the substrate further comprises a spacer surrounding the dummy gate, and
   wherein the trench is self-aligned with the spacer.

4. The method claimed in claim 1, wherein the substrate further comprises deep source and drain regions and shallow source and drain extensions formed in the silicon germanium layer on opposing sides of the dummy gate.

5. The method claimed in claim 4, wherein the dielectric material is formed to a height in the trench such that the strained silicon channel region grown on the dielectric material is approximately aligned with the shallow source and drain extensions in the silicon germanium layer.

6. The method claimed in claim 5, wherein the substrate further comprises source and drain silicides formed on the deep source and drain regions.

7. The method claimed in claim 1, wherein the substrate further comprises shallow trench isolations defining an active region of the substrate, and
   wherein the dummy gate is located within the active region.

8. The method claimed in claim 1, wherein the dummy gate is comprised of polysilicon.

9. The method claimed in claim 1, wherein providing the substrate comprises:
   providing the substrate having the layer of silicon germanium formed thereon; and
   forming shallow trench isolations in the silicon germanium layer defining an active region of the substrate.

10. The method claimed in claim 9, wherein providing the substrate further comprises patterning the dummy gate over the layer of silicon germanium in the active region.

11. The method claimed in claim 10, wherein providing the substrate further comprises implanting shallow source and drain extensions in the silicon germanium layer.

12. The method claimed in claim 11, wherein providing the substrate further comprises forming a spacer around the dummy gate.

13. The method claimed in claim 12, wherein providing the substrate further comprises implanting deep source and drain regions in the silicon germanium layer.

14. The method claimed in claim 13, wherein providing the substrate further comprises forming source and drain silicides in the source and drain regions.

15. The device claim in claim 1, wherein the dielectric material is one of $DyScO_3$ and $GdScO_3$.

* * * * *